(12) United States Patent
Kao et al.

(10) Patent No.: US 7,868,668 B2
(45) Date of Patent: Jan. 11, 2011

(54) POWER-ON DETECTOR AND METHOD THEREOF

(75) Inventors: Yung-Shin Kao, Hsinchu (TW);
Nan-Chun Lien, Taipei (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/465,071

(22) Filed: May 13, 2009

(65) Prior Publication Data

US 2010/0289529 A1 Nov. 18, 2010

(51) Int. Cl.
*H03L 7/00* (2006.01)

(52) U.S. Cl. .................. 327/143; 327/50; 327/142; 327/198

(58) Field of Classification Search .................. 327/142, 327/143, 198
See application file for complete search history.

(56) References Cited

U.S. PATENT DOCUMENTS

| 6,137,324 | A | 10/2000 | Chung | |
|---|---|---|---|---|
| 6,894,543 | B2 * | 5/2005 | Ho et al. | 327/108 |
| 7,046,055 | B2 * | 5/2006 | Lee et al. | 327/143 |

\* cited by examiner

*Primary Examiner*—Lincoln Donovan
*Assistant Examiner*—John W Poos
(74) *Attorney, Agent, or Firm*—Winston Hsu; Scott Margo

(57) ABSTRACT

A power-on detector and a method thereof are provided. The power-on detector includes four transistors, two resistors, and a comparator. The power-on detector can detect an input voltage and then determine whether the power is turned on or not. The power-on determination is substantially immune to temperature variation. The power-on detector is noise-free and stable in various temperatures.

11 Claims, 6 Drawing Sheets

US 7,868,668 B2
POWER-ON DETECTOR AND METHOD THEREOF

BACKGROUND OF THE INVENTION

1. Field of the Invention

The present invention relates to a power-on detector. More particularly, the present invention relates to a power-on detector with temperature immunity.

2. Description of Related Art

In many electronic devices and circuits, a power-on detector is generally used to detect whether an external power is turned on. For example, when a supplied power is increased to a threshold value of 1 volt (V), the power-on detector then determines the power is turned on. However, in allusion to design requirements of energy-saving and processing of consumer products, the threshold value becomes smaller and smaller, and a processing size also becomes smaller and smaller. Now, a circuit of the power-on detector can be influenced by temperature, so that whether the power is turned on can be misjudged. The conventional power-on detectors are categorised into two types of a bandgap type and a P/N device+resistance type. FIG. 1 is a diagram of a conventional bandgap type power-on detector. When an input voltage $V_{cck}$ is provided, the bandgap type power-on detector 100 determines whether the power is turned on according to a difference between a positive end voltage Vpos2 and a negative end voltage Vneg2. Though the difference is less influenced by the temperature, the difference itself is quite small, for example, 13.99 mV, so that, the power-on detector 100 can make a false judgement due to a device variation generated under a 65 nanometer processing.

FIG. 2 is a diagram of a conventional P/N device+resistance type power-on detector. When the input voltage $V_{cck}$ is provided to the P/N device+resistance type power-on detector 200, the power-on detector 200 determines whether the power is turned on according to a difference between a positive end voltage Vpos3 and a negative end voltage Vneg3. The difference between the positive end voltage Vpos3 and the negative end voltage Veng3 can be changed along with the temperature. For example, the difference of (Vpos3−Vneg3) can be 142.8 mV under −40° C., and can be 21.08 mV under 125° C., so that a determination result of the power-on detector 200 can be greatly different under different temperatures.

SUMMARY OF THE INVENTION

Accordingly, the present invention is directed to a power-on detector for detecting an input voltage to determine whether the power is turned on, wherein a power-on determination is substantially immune to temperature, and the power-on detector is noise-free and stable in various temperatures, and has a temperature immunity effect.

The present invention provides a power-on detector including a voltage-detecting unit, wherein the voltage-detecting unit is configured for receiving an input voltage, and detecting the input voltage to output a first output voltage. The voltage-detecting unit includes a first transistor, a second transistor, a third transistor, a fourth transistor, a first resistor, a second resistor and a comparator, wherein the first transistor is coupled to the input voltage, the second transistor is coupled to the input voltage, the third transistor is coupled to the ground, the fourth transistor is coupled to the ground, the first resistor is coupled between the first transistor and the third transistor, and the second resistor is coupled between the second transistor and the fourth transistor. Moreover, an output terminal of the comparator outputs the first output voltage, a negative input terminal of the comparator is coupled to a common node of the third transistor and the first resistor, and a positive input terminal of the comparator is coupled to a common node of the second transistor and the second resistor.

In an embodiment of the present invention, the first transistor and the second transistor are p-channel metal oxide semiconductor field effect transistors (PMOS transistors), wherein a source of the first transistor is coupled to the input voltage, a drain of the first transistor is coupled to the first resistor and a gate of the first transistor, a source of the second transistor is coupled to the input voltage, and a drain of the second transistor is coupled to the second resistor and a gate of the second transistor.

In an embodiment of the present invention, the third transistor and the fourth transistor are n-channel metal oxide semiconductor field effect transistors (NMOS transistors), wherein a source of the third transistor is coupled to the ground, a drain of the third transistor is coupled to the first resistor and a gate of the third transistor, a source of the fourth transistor is coupled to the ground, and a drain of the fourth transistor is coupled to the second resistor and a gate of the fourth transistor.

In an embodiment of the present invention, the ratio of the size the first transistor to the size of the second transistor is a predetermined ratio, and the ratio of the size of the fourth transistor to the size of the third transistor is the same predetermined ratio.

In an embodiment of the present invention, the first transistor, the second transistor, the third transistor and the fourth transistor operate in a sub-threshold region.

In an embodiment of the present invention, the power-on detector further includes a third resistor, wherein one terminal of the third resistor is coupled to the input voltage, and another terminal of the third resistor is coupled to the first transistor and the second transistor.

In an embodiment of the present invention, the power-on detector further includes a filter for receiving the first output voltage to perform a resistor-capacitor (RC) timing delay process, so as to output a second output voltage.

The present invention provides another power-on detector including a voltage-detecting unit, a filter and a trigger. The voltage-detecting unit receives an input voltage and detects the input voltage to output a first output voltage, and when a voltage value of the input voltage is equal to a specified voltage, the specified voltage is determined according to a first overdrive voltage of a first transistor of the voltage-detecting unit, a second overdrive voltage of a second transistor of the voltage-detecting unit, a first threshold voltage of the first transistor, and a second threshold voltage of the second transistor. The filter is coupled to the voltage-detecting unit, and is configured for receiving the first output voltage to generate a second output voltage, and when the first output voltage is decreased to a logic low level, a third transistor of the filter is turned off to increase the second output voltage to the logic high level. The trigger is coupled to the filter, and is configured for receiving the second output voltage to perform an anti-noise process, so as to output a third output voltage.

In an embodiment of the present invention, the specified voltage is obtained according to a positive temperature coefficient parameter, and the positive temperature coefficient parameter is obtained according to a sub-threshold slope factor, a thermal voltage and a ratio.

In an embodiment of the present invention, when a first current flowing through the first transistor is substantially equal to a second current flowing through the second transistor, the specified voltage is obtained according to the first overdrive voltage, the second overdrive voltage, the first threshold voltage, the second threshold voltage, and the positive temperature coefficient parameter.

In an embodiment of the present invention, the ratio is obtained according to a ratio between a first resistor and a second resistor in the voltage-detecting unit.

In an embodiment of the present invention, the first overdrive voltage and the second overdrive voltage have positive temperature coefficients, the first threshold voltage an the second threshold voltage have negative temperature coefficients, and when a temperature is varied, variation of the specified voltage is decreased by controlling the first overdrive voltage, the second overdrive voltage, the positive temperature coefficient parameter, the first threshold voltage and the second threshold voltage.

In an embodiment of the present invention, the power-on detector further includes a comparator, wherein a first input terminal of the comparator is coupled to the second transistor, a second input terminal of the comparator is coupled to the first transistor, and when a voltage received by the first input terminal is substantially equal to a voltage received by the second input terminal, a voltage value of the input voltage is equal to the specified voltage.

The present invention provides a power-on detecting method. The method can be described as follows. First, an input voltage is received and detected to output a first output voltage, and when a voltage value of the input voltage is equal to a specified voltage, the specified voltage is determined according to a first overdrive voltage, a second overdrive voltage, a first threshold voltage, and a second threshold voltage. Next, the first output voltage is received to generate a second output voltage, and when the first output voltage is decreased to a logic low level, the second output voltage is increased to the logic high level. Next, the second output voltage is received to perform an anti-noise process, so as to output a third voltage.

In an embodiment of the present invention, the power-on detecting method further includes generating a positive temperature coefficient parameter according to a sub-threshold slope factor, a thermal voltage and a ratio, and the positive temperature coefficient parameter is used for determining the specified voltage.

In an embodiment of the present invention, when a first current flowing through a first transistor is substantially equal to a second current flowing through a second transistor, the specified voltage is determined according to the first overdrive voltage, the second overdrive voltage, the first threshold voltage, the second threshold voltage and the positive temperature coefficient parameter.

In an embodiment of the present invention, the ratio is determined according to a ratio between a first resistor and a second resistor.

In an embodiment of the present invention, the first overdrive voltage and the second overdrive voltage have positive temperature coefficients, the first threshold voltage an the second threshold voltage have negative temperature coefficients, and when a temperature is varied, variation of the specified voltage is decreased by controlling the first overdrive voltage, the second overdrive voltage, the positive temperature coefficient parameter, the first threshold voltage and the second threshold voltage.

In an embodiment of the present invention, when the input voltage is received, and when a voltage received by a first input terminal is substantially equal to a voltage received by a second input terminal, a voltage value of the input voltage is equal to the specified voltage.

In summary, according to the power-on detector of the present invention, the power-on determination is substantially immune to the temperature, and the power-on detector is noise-free and stable in various temperatures.

In order to make the aforementioned and other features and advantages of the present invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
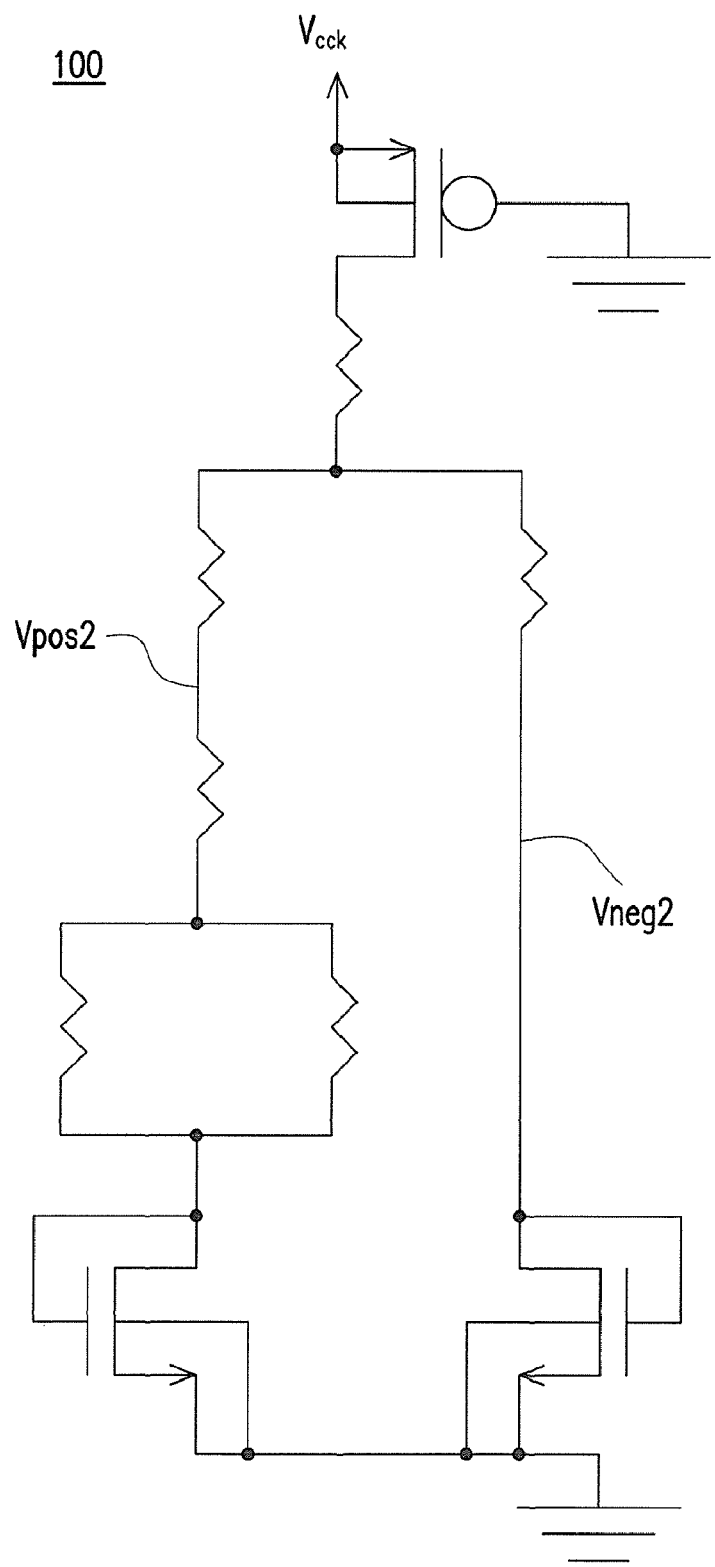
FIG. 1 is a diagram of a conventional bandgap type power-on detector.
Figure 2:
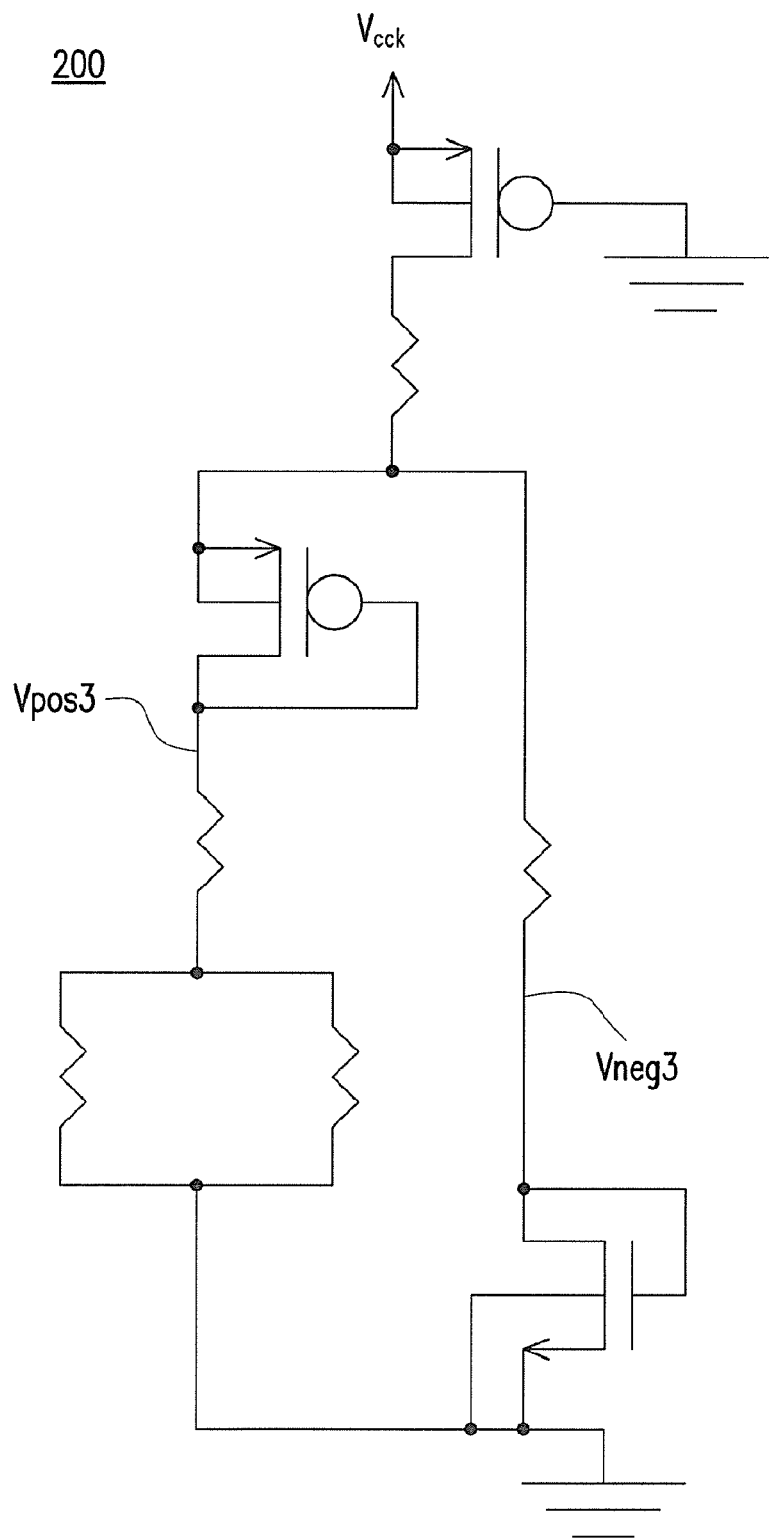
FIG. 2 is a diagram of a conventional P/N device+resistance type power-on detector.
Figure 3:
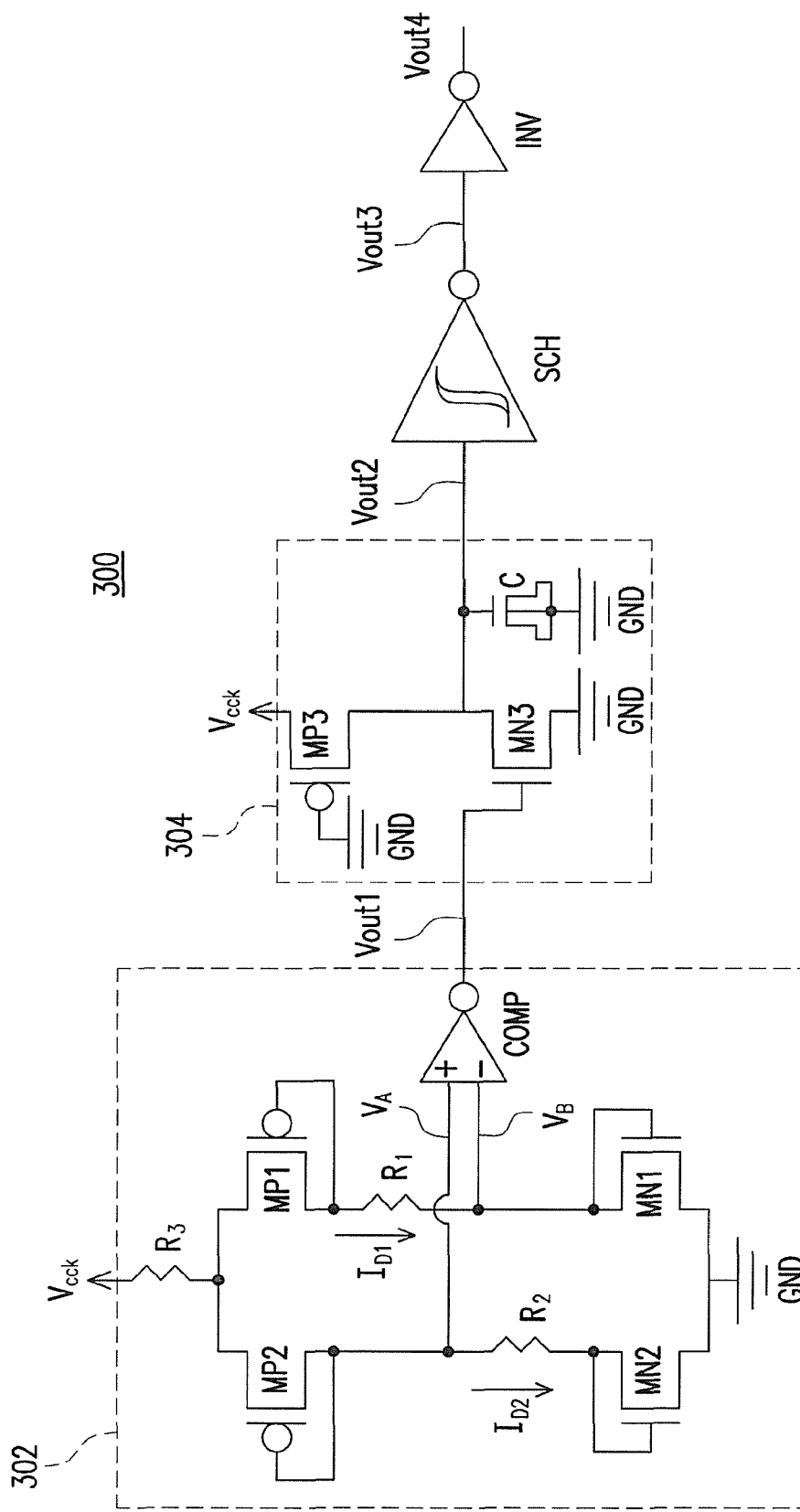
FIG. 3 is a diagram of a power-on detector according to an embodiment of the present invention.

Referring to FIG. 3, FIG. 3 is a diagram of a power-on detector 300 according to an embodiment of the present invention. The power-on detector 300 includes a voltage-detecting unit 302, a filter 304, a trigger SCH and an inverter INV. The voltage-detecting unit 302 received an input voltage $V_{cck}$, and detects the input voltage $V_{cck}$ to output an output voltage Vout1. In the present embodiment, the trigger SCH can be a Schmitt trigger. Further, the voltage-detecting unit 302 includes two PMOS transistors MP1 and MP2, two NMOS transistors MN1 and MN2, three resistors $R_1$, $R_2$ and $R_3$, and a comparator COMP, wherein a current $I_{D1}$ flows through the resistor $R_1$, and a current $I_{D2}$ flows through the resistor $R_2$.

One terminal of the resistor $R_3$ is coupled to the input voltage $V_{cck}$, and another terminal thereof is coupled to a source of the PMOS transistor MP1 and a source of the PMOS transistor MP2. Moreover, a drain of the PMOS transistor MP1 is coupled to the resistor $R_1$ and a gate of the PMOS transistor MP1, and a drain of the PMOS transistor MP2 is coupled to a gate of the PMOS transistor MP2, the resistor $R_2$ and a positive input terminal of the comparator COMP. A voltage of the drain of the PMOS transistor MP2 is a comparator positive input terminal voltage $V_A$.

A source of the NMOS transistor MN1 and a source of the NMOS transistor MN2 are coupled to the ground GND. Moreover, a drain of the NMOS transistor MN2 is coupled to the resistor $R_2$ and a gate of the NMOS transistor MN2, a drain of the NMOS transistor MN1 is coupled to a gate of the NMOS transistor MN1, the resistor $R_1$ and a negative input terminal of the comparator COMP. Moreover, a voltage of the drain of the NMOS transistor MN1 is a comparator negative input terminal voltage $V_B$.

In addition, the transistors of the voltage-detecting unit 302 are further designed, so that a size of the PMOS transistor MP1 is m times greater than a size of the PMOS transistor MP2, and a size of the NMOS transistor MN2 is also m times greater than a size of the NMOS transistor MN1, wherein m is a predetermined constant, and the transistors MP1, MP2, MN1 and MN2 all operate in a sub-threshold region. The comparator COMP receives the comparator positive input terminal voltage $V_A$ and the comparator negative input terminal voltage $V_B$, and outputs the output voltage Vout1 to the filter 304. When the input voltage $V_{cck}$ starts to provide a voltage to the voltage-detecting unit 302, if the comparator positive input terminal voltage $V_A$ is greater than or equal to the comparator negative input terminal voltage $V_B$, the output voltage Vout1 is then decreased from a logic high level to a logic low level.

Regarding a design of the filter 304, the filter 304 is configured for receiving the output voltage Vout1 to perform an RC timing delay process, so as to output an output voltage Vout2. The filter 304 includes a PMOS transistor MP3, a NMOS transistor MN3 and a capacitor C. A gate of the PMOS transistor MP3 is coupled to the ground GND, a source of the PMOS transistor MP3 is coupled to the input voltage $V_{cck}$, and a drain of the PMOS transistor MP3 is coupled to the capacitor C and a drain of the NMOS transistor NM3, while another terminal of the capacitor C is coupled to the ground GND. The output voltage Vout2 is provided by the capacitor C.

A gate of the NMOS transistor MN3 of the filter 304 receives the output voltage Vout1, and a source of the NMOS transistor MN3 is coupled to the ground GND. Accordingly, when the output voltage Vout1 is decreased to the logic low level, the NMOS transistor MN3 is turned off, so that the output voltage Vout2 is increased to the logic high level due to charging of the capacitor C. To achieve an anti-noise function of the power-on detector 300, the Schmitt trigger SCH processes the output voltage Vout2 and transmits the output voltage Vout3 to the inverter INV. The inverter INV inverts the output voltage Vout3, and outputs an output voltage Vout4.

For a clear understanding of a temperature influence on the power-on detector 300, parameters are defined below to explain circuit characteristics:

$V_{GSN1}$: a voltage difference between the gate and the source of the NMOS transistor MN1;

$V_{GSN2}$: a voltage difference between the gate and the source of the NMOS transistor MN2;

$V_{DSN1}$: a voltage difference between the drain and the source of the NMOS transistor MN1;

$V_{DSN2}$: a voltage difference between the drain and the source of the NMOS transistor MN2;

$V_{DSP1}$: a voltage difference between the drain and the source of the PMOS transistor MP1;

$V_{DSP2}$: a voltage difference between the drain and the source of the PMOS transistor MP2;

$V_{THP}$: a threshold voltage of the PMOS transistor;

$V_{THN}$: a threshold voltage of the NMOS transistor;

$V_T$: a thermal voltage;

A: an aspect ratio of the transistor, i.e. a width of the transistor divided by a length of the transistor;

$\mu_n$: a mobility of the NMOS transistor;

$\zeta$: a sub-threshold slope factor;

$V_{OVN1}$: an overdrive voltage of the NMOS transistor MN1;

$V_{OVN2}$: an overdrive voltage of the NMOS transistor MN2;

$V_{OVP1}$: an overdrive voltage of the PMOS transistor MP1;

$\Delta V_{OVN}$: an overdrive voltage difference between the NMOS transistors MN1 and MN2;

$V_{rr}$: a specified voltage, i.e. the input voltage $V_{cck}$ supplied when the output voltage Vout1 is transferred from the logic high level to the logic low level.

According to the above definitions, the following equations are deduced:

$$V_{OVN1} = V_{GSN1} - V_{THN} = \zeta V_T(\ln(I_{D1}) - \ln(A\mu_n V_T^2));$$

$$V_{OVN2} = V_{GSN2} - V_{THN} = \zeta V_T(\ln(I_{D2}) - \ln(mA\mu_n V_T^2));$$

$$\Delta V_{OVN} = V_{OVN1} - V_{OVN2} = \zeta V_T \ln(mI_{D1}/I_{D2});$$

$$V_{cck} = V_{DSP1} + I_{D1}R_1 + V_{DSN1} + (I_{D1} + I_{D2})R_3$$
$$= V_{DSP2} + I_{D2}R_2 + V_{DSN2} + (I_{D1} + I_{D2})R_3.$$

When the comparator positive input terminal voltage $V_A$ is substantially equal to the comparator negative input terminal voltage $V_B$, a voltage value of the input voltage $V_{cck}$ is equal to the specified voltage $V_{rr}$, so that $$I_{D2}R_2 = V_{DSN1} - V_{DSN2} = \zeta V_T \ln(mI_{D1}/I_{D2}) = \Delta V_{OVN}.$$

Similarly, $I_{D1}R_1 = \Delta V_{OVP}$, so that according to a design of the power-on detector 300, when $I_{D1} \approx I_{D2}$, the specified voltage Vrr is a sum of the related parameters:

$$Vrr = V_{DSP1} + I_{D1}R_1 + V_{DSN1} + (I_{D1} + I_{D2})R_3$$
$$= V_{OVP1} + V_{THP} + I_{D1}R_1 + V_{OVN2} +$$
$$V_{THN} + \Delta V_{OVN} + (I_{D1} + I_{D2})R_3$$
$$= V_{OVP1} + V_{THP} + V_{OVN2} + V_{THN} +$$
$$2\zeta V_T[\ln m] + 2R_3(\zeta V_T[\ln m])/R_2.$$

Wherein, $V_{OVN2}$, $V_{OVP1}$, $\zeta V_T[\ln m]$ and $R_3(\zeta V_T[\ln m])/R_2$ have positive temperature coefficients, and $V_{THP}$ and $V_{THN}$ have negative temperature coefficients. In other words, $V_{OVN2}$, $V_{OVP1}$, $\zeta V_T[\ln m]$ and $R_3(\zeta V_T[\ln m])/R_2$ are positive temperature coefficient parameters, and $V_{THP}$ and $V_{THN}$ are negative temperature coefficient parameters. Further, when the temperature is increased, $V_{OVN2}$, $V_{OVP1}$, $\zeta V_T[\ln m]$ and $R_3(\zeta V_T[\ln m])/R_2$ are increased accordingly, and $V_{THP}$ and $V_{THN}$ are decreased. Therefore, when the power-on detector 300 is designed, $V_{OVN2}$, $V_{OVP1}$, $\zeta V_T[\ln m]$, $R_3(\zeta V_T[\ln m])/R_2$, $V_{THP}$ and $V_{THN}$ can be designed to reduce an influence of the temperature variation to the specified voltage $V_{rr}$, namely, to reduce the influence of the temperature variation on the power-on detector 300 determining whether the power is turned on.

Figure 4A:
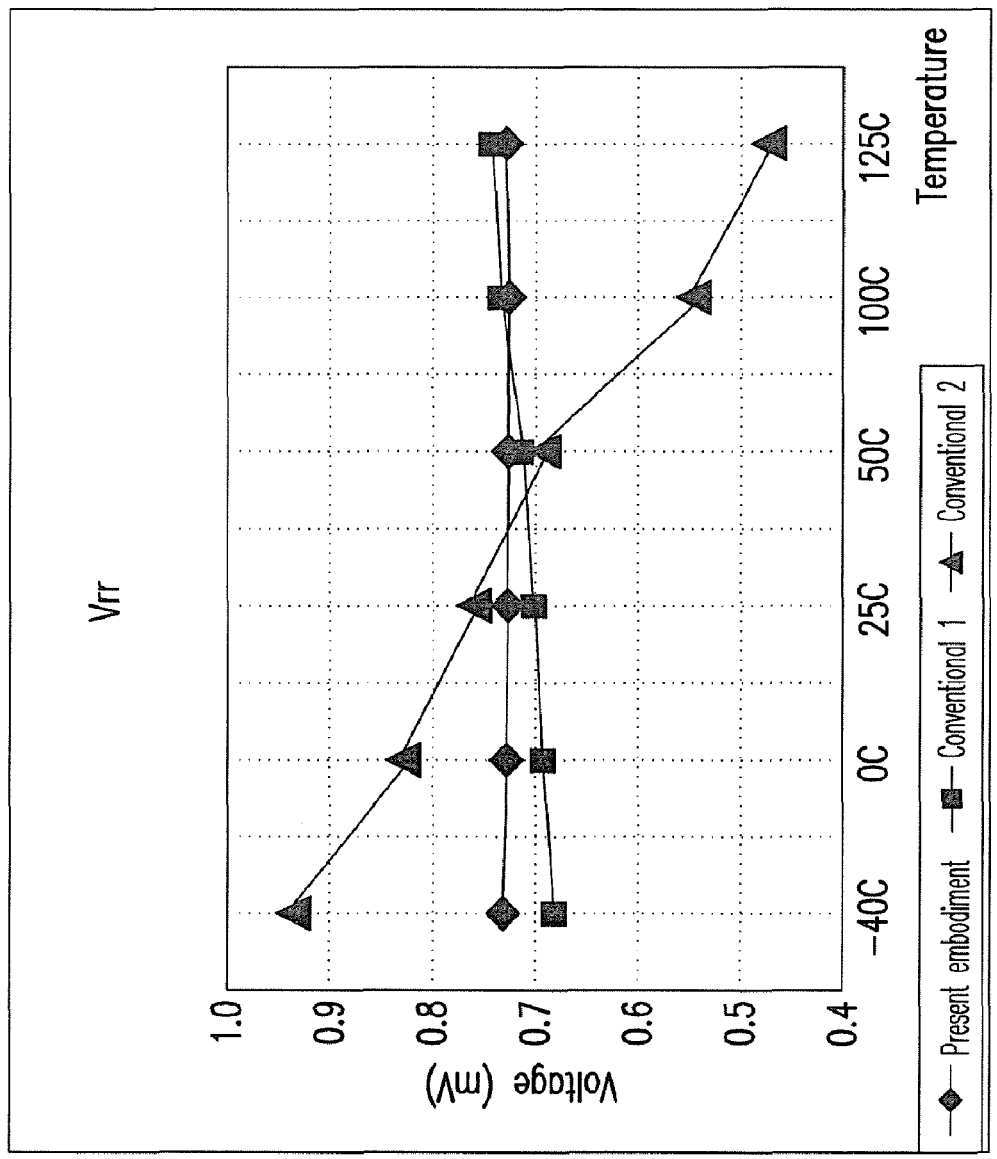
FIG. 4A and FIG. 4B are diagrams illustrating comparisons between a power-on detector according to an embodiment of the present invention and power-on detectors of the conventional technique.
Figure 4B:
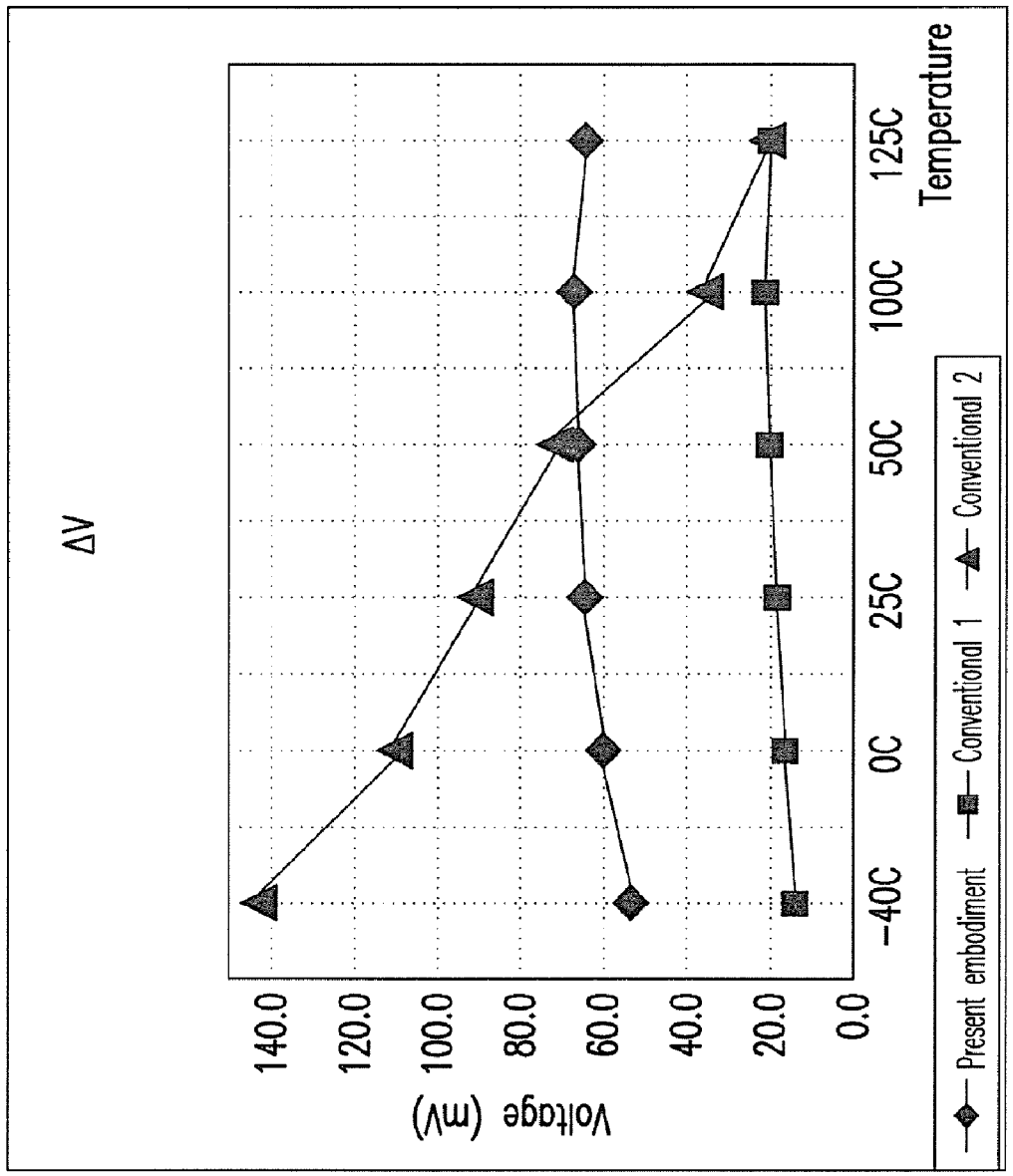

Referring to FIG. 4A and FIG. 4B, FIG. 4A and FIG. 4B are diagrams illustrating comparisons between a power-on detector of an embodiment of the present invention and that of the conventional technique, wherein "present embodiment" represents a performance of the power-on detector 300, "conventional 1" represents a performance of the conventional bandgap type power-on detector 100, and "conventional 2" represents a performance of the conventional P/N device+resistance type power-on detector 200. Further, $V_{rr}$ of FIG. 4A represent voltage values of the input voltages $V_{cck}$ when various power-on detectors determine that the power is turned on. It is obvious that under different temperature variations, the input voltage $V_{cck}$ supplied when the power-on detector 300 determines that the power is turned on is less influenced by the temperature compared to the input voltages of other power-on detectors.

In FIG. 4B, $\Delta V$ represents voltage differences, according which various power-on detectors determine whether the power is turned on. The "present embodiment" part represents voltage differences between the comparator positive input terminal voltages $V_A$ and the comparator negative input terminal voltages $V_B$ in the power-on detector 300, the "conventional 1" part represents voltage differences between Vpos2 and Vneg2 in the conventional bandgap type power-on detector 100, and the "conventional 2" part represents voltage differences between Vpos3 and Vneg3 in the conventional P/N device+resistance type power-on detector 200. According to the comparison of FIG. 4, it is obvious that compared to other power-on detectors, the power-on detector 300 is less influenced by the temperature variation when determining whether the power is turned on.

Figure 5:
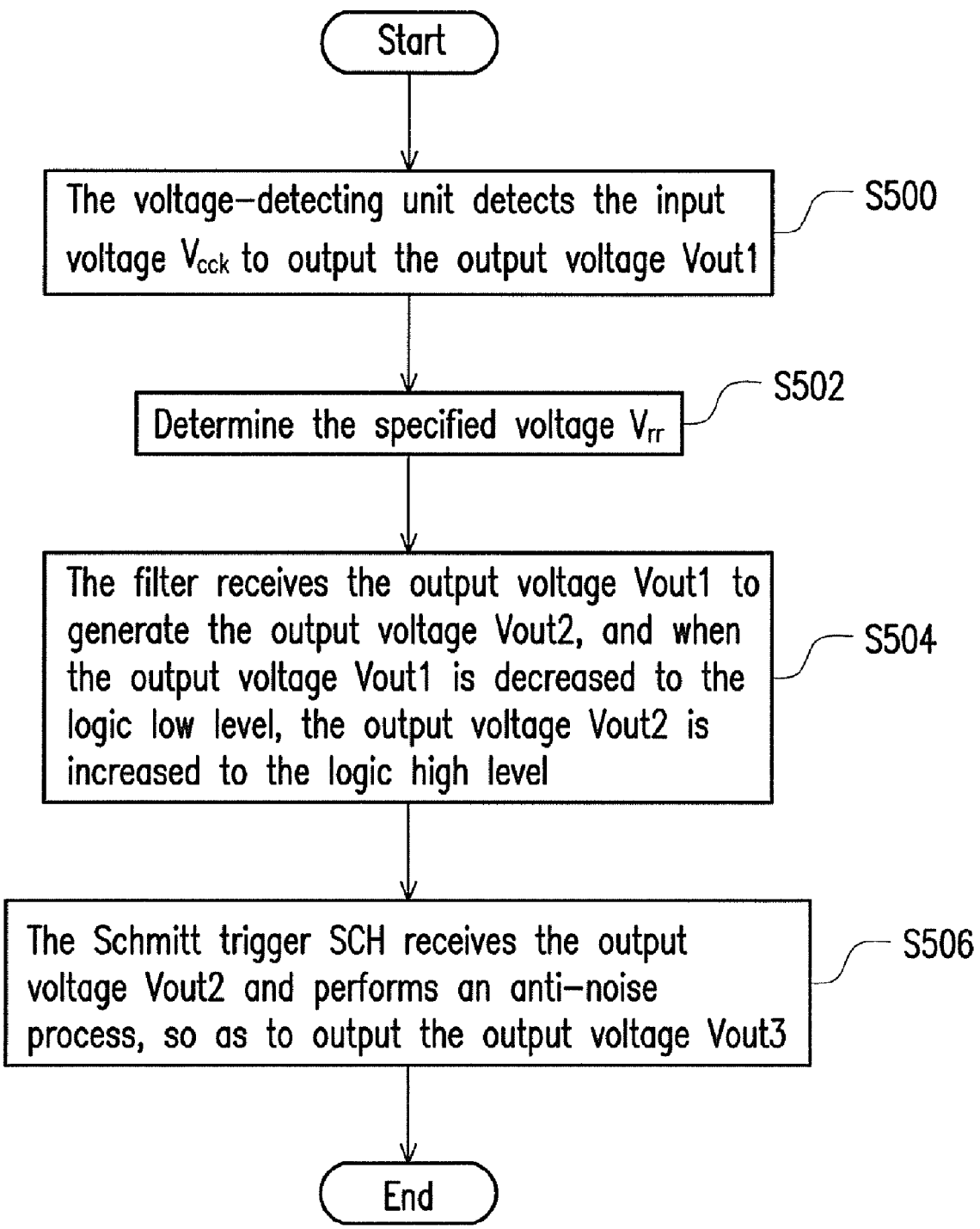
FIG. 5 is a flowchart illustrating a power-on detecting method according to an embodiment of the present invention.

According to the above description of the power-on detector, the present invention provides a power-on detecting method. Referring to FIG. 5, FIG. 5 is a flowchart illustrating a power-on detecting method according to an embodiment of the present invention. First, the voltage-detecting unit 302 detects the input voltage $V_{cck}$ to output the output voltage Vout1 (step S500). Next, the specified voltage $V_{rr}$ is determined (step S502), wherein $$V_{rr}=V_{OVP1}+V_{THP}+V_{OVN2}+V_{THN}+2\zeta V_T[\ln m]+2R_3(\zeta V_T[\ln m])/R_2.$$

Next, the filter 304 receives the output voltage Vout1 to generate the output voltage Vout2, and when the output voltage Vout1 is decreased to the logic low level, the output voltage Vout2 is increased to the logic high level (step S504). Finally, the Schmitt trigger SCH receives the output voltage Vout2 and performs an anti-noise process, so as to output the output voltage Vout3 (step S506).

In summary, the power-on detector provided by the present invention detects the input voltage to determine whether the power is turned on, the power-on determination is substantially immune to the temperature. The power-on detector is noise-free and stable in various temperatures, and has a temperature immunity effect.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A power-on detector, comprising:
   a voltage-detecting unit, configured for receiving an input voltage, and detecting the input voltage to output a first output voltage, the voltage-detecting unit comprising:
   a first transistor, wherein a source of the first transistor is coupled to the input voltage, and a gate and a drain of the first transistor are coupled to each other;
   a second transistor, wherein a source of the second transistor is coupled to the input voltage, and a gate and a drain of the second transistor are coupled to each other;
   a third transistor, wherein a source of the third transistor is coupled to a ground, and a gate and a drain of the third transistor are coupled to each other;
   a fourth transistor, wherein a source of the fourth transistor is coupled to the ground, and a gate and a drain of the fourth transistor are coupled to each other;
   a first resistor, having a first terminal coupled to the drain of the first transistor, and a second terminal coupled to the drain of the third transistor;
   a second resistor, having a first terminal coupled to the drain of the second transistor, and a second terminal coupled to the drain of the fourth transistor; and
   a comparator, having an output terminal outputting the first output voltage, a negative input terminal coupled to the second terminal of the first resistor, and a positive input terminal coupled to the first terminal of the second resistor, wherein the first transistor and the second transistor are PMOS transistors, and the third transistor and the fourth transistor are NMOS transistors.

2. The power-on detector as claimed in claim 1, wherein a ratio of a size of the first transistor to a size of the second transistor is a predetermined ratio, and a ratio of a size of the fourth transistor to a size of the third transistor is the predetermined ratio.

3. The power-on detector as claimed in claim 1, wherein the first transistor, the second transistor, the third transistor and the fourth transistor operate in a sub-threshold region.

4. The power-on detector as claimed in claim 1, the sources of the first transistor and the second transistor are coupled to the input voltage through a third resistor.

5. The power-on detector as claimed in claim 4, further comprising:
   a filter, coupled to the voltage-detecting unit and configured for receiving the first output voltage to perform an RC timing delay process, so as to output a second output voltage;
   a trigger, coupled to the filter and configured for receiving the second output voltage to perform an anti-noise process, so as to output a third output voltage; and
   an inverter, coupled to the trigger and configured for receiving and inverting the third output voltage, so as to output a fourth output voltage.

6. The power-on detector as claimed in claim 5, wherein when a voltage value of the input voltage is equal to a specified voltage, the specified voltage is determined according to a first overdrive voltage of the first transistor, a second overdrive voltage of the second transistor, a first threshold voltage of the first transistor, and a second threshold voltage of the second transistor; and
   when the first output voltage is decreased to a logic low level, the second output voltage is increased to a logic high level.

7. The power-on detector as claimed in claim 6, wherein the specified voltage is obtained according to a positive temperature coefficient parameter, and the positive temperature coefficient parameter is obtained according to a sub-threshold slope factor, a thermal voltage and a ratio.

8. The power-on detector as claimed in claim 7, wherein when a first current flowing through the first transistor is substantially equal to a second current flowing through the second transistor, the specified voltage is obtained according to the first overdrive voltage, the second overdrive voltage, the first threshold voltage, the second threshold voltage, and the positive temperature coefficient parameter.

9. The power-on detector as claimed in claim 7, wherein the ratio is obtained according to a ratio between the first resistor and the second resistor.

10. The power-on detector as claimed in claim 7, wherein the first overdrive voltage and the second overdrive voltage have positive temperature coefficients, the first threshold voltage and the second threshold voltage have negative temperature coefficients, and when a temperature is varied, variation of the specified voltage is decreased by controlling the first overdrive voltage, the second overdrive voltage, the positive temperature coefficient parameter, the first threshold voltage and the second threshold voltage.

11. The power-on detector as claimed in claim 6, wherein when a voltage received by the negative input terminal is substantially equal to a voltage received by the positive input terminal, a voltage value of the input voltage is equal to the specified voltage.

* * * * *